(12) United States Patent
Mardi et al.

(10) Patent No.: US 7,235,412 B1
(45) Date of Patent: Jun. 26, 2007

(54) SEMICONDUCTOR COMPONENT HAVING TEST PADS AND METHOD AND APPARATUS FOR TESTING SAME

(75) Inventors: Mohsen Hossein Mardi, Fremont, CA (US); Jae Cho, Saratoga, CA (US); Xin X. Wu, Fremont, CA (US); Chih-Chung Wu, Hsinchu (TW); Shih-Liang Liang, Chung Li (TW); Sanjiv Stokes, Los Altos, CA (US); Hassan K. Bazargan, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 238 days.

(21) Appl. No.: 10/842,770

(22) Filed: May 11, 2004

(51) Int. Cl.
*H01L 21/66* (2006.01)

(52) U.S. Cl. .............................. 438/14; 438/15; 438/18

(58) Field of Classification Search .................. 438/14, 438/15, 18
See application file for complete search history.

(56) References Cited

U.S. PATENT DOCUMENTS

| | | | |
|---|---|---|---|
| 5,506,499 A | | 4/1996 | Puar |
| 5,554,940 A | * | 9/1996 | Hubacher .................... 324/765 |
| 5,635,424 A | | 6/1997 | Rostoker et al. |
| 5,923,047 A | | 7/1999 | Chia et al. |
| 6,380,555 B1 | * | 4/2002 | Hembree et al. ............. 257/48 |
| 6,617,181 B1 | | 9/2003 | Wright et al. |
| 6,630,837 B2 | | 10/2003 | Wark |
| 6,869,809 B2 | * | 3/2005 | Yu et al. ........................ 438/14 |

OTHER PUBLICATIONS

U.S. Appl. No. 10/842,756, filed May 11, 2004, Eghan et al.

* cited by examiner

*Primary Examiner*—Andy Huynh
*Assistant Examiner*—Thinh T Nguyen
(74) *Attorney, Agent, or Firm*—Robert Brush

(57) ABSTRACT

A semiconductor component having test pads and a method and apparatus for testing the same is described. In an example, an un-bumped substrate is obtained having a pattern of bond pads configured to support bumped contacts and a plurality of test pads. Each of the plurality of test pads is in electrical communication with a respective one of the bond pads. The substrate is tested using the plurality of test pads. In another example, a substrate is fabricated having a pattern of bond pads configured to support bumped contacts and a plurality of test pads. Each of the plurality of test pads is in electrical communication with a respective one of the bond pads. The substrate is tested using the plurality of test pads. An insulating layer is formed over the plurality of test pads.

14 Claims, 4 Drawing Sheets

US 7,235,412 B1

SEMICONDUCTOR COMPONENT HAVING TEST PADS AND METHOD AND APPARATUS FOR TESTING SAME

FIELD OF THE INVENTION

One or more aspects of the present invention relate generally to testing and manufacture of semiconductor devices and, more particularly, to a semiconductor component having test pads and a method and apparatus for testing the same.

BACKGROUND OF THE INVENTION

Semiconductor dice are typically produced by creating several identical devices on a semiconductor substrate, using known techniques of photolithography, deposition, and the like. One type of semiconductor die includes bond pads distributed across the entire surface of the die for supporting bumped contacts. The bond pads are in electrical communication with metal layers disposed on the die and with transistors, resistors, and other electronic circuits integrated within the die. After fabrication, the substrate may be "bumped" by forming bumped contacts on each of the bond pads. The bumped contacts are typically formed of solderable material, such as lead-tin alloy. Bumped dies are often used for flip chip bonding, where the die is mounted face down on a supporting substrate, such as a circuit board or lead-frame, by welding or soldering. The mounted die may then be encapsulated or "packaged" to form an integrated circuit.

In practice, certain physical defects in the substrate, as well as certain defects in the processing of the substrate, inevitably lead to some of the dice being "good" (i.e., fully-functional) and some of the dice being "bad" (i.e., not-fully-functional). Thus, the dice are typically tested before being mounted on the supporting substrate. One type of conventional testing process involves using a testing device to make a plurality of discrete pressure connections to the bond pads on the substrate and provide signals (e.g., power and data signals) to the dice. However, such physical contact may damage the bond pads, which may ruin an entire die or even the entire substrate.

Another type of conventional testing process involves testing the die or substrate subsequent to being bumped by making discrete pressure connections to the bumped contacts. However, such physical contact may damage the bumped contacts, which may also ruin the bumped die/substrate. Specifically, the bumped contacts can become deformed during testing such that they are unusable to attach the die to the supporting substrate. Moreover, testing bumped substrate or die results in additional expense and undue delay in the manufacturing process if the substrate was bad after fabrication.

Accordingly, there exists a need in the art for semiconductor components capable of being more easily tested without causing damage thereto, as well as for improved test procedures for such semiconductor devices.

SUMMARY OF THE INVENTION

One aspect of the invention relates to testing a semiconductor component. An un-bumped substrate is obtained having a pattern of bond pads configured to support bumped contacts and a plurality of test pads. Each of the plurality of test pads is in electrical communication with a respective one of the bond pads. The substrate is tested using the plurality of test pads. Notably, a testing device may contact the test pads without contacting the bond pads, avoiding damage thereto.

Another aspect of the invention relates to fabricating a semiconductor component. A substrate is fabricated having a pattern of bond pads configured to support bumped contacts and a plurality of test pads. Each of the plurality of test pads is in electrical communication with a respective one of the bond pads. The substrate is tested using the plurality of test pads. An insulating layer is formed over the plurality of test pads. The substrate may be bumped to define bumped contacts for the bond pads. The substrate may include at least one semiconductor die formed thereon. The at least one semiconductor die may be mounted to a respective at least one supporting substrate, such as a circuit board or lead-frame. The insulating layer prevents the test pads from interfering with the bumping and mounting processes.

Another aspect of the invention relates to a semiconductor component. A substrate is configured to have at least one conductor layer disposed thereon. The at least one conductor layer includes first portions that define a pattern of bump pads configured to support bumped contacts, and second portions that define a plurality of test pads. Each of the plurality of test pads is in electrical communication with a respective one of the bond pads. A passivation layer is disposed on the at least one conductor layer. The passivation layer includes first openings aligned with the first portions and second openings aligned with the second portions. An insulating layer is disposed within the second openings.

Another aspect of the invention relates to a semiconductor component. A substrate is configured to have at least one conductor layer disposed thereon. The at least one conductor layer includes first portions that define a pattern of bond pads configured to support bumped contacts, and second portions that define a plurality of test pads. Each of the plurality of test pads is in electrical communication with a respective one of the bond pads. A passivation layer is disposed on the at least one conductor layer. The passivation layer includes openings aligned with pairs of the first portions and the second portions. An insulating layer is disposed over the second portions.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment (s) shown, but are for explanation and understanding only.

DETAILED DESCRIPTION OF THE DRAWINGS

Figure 1:
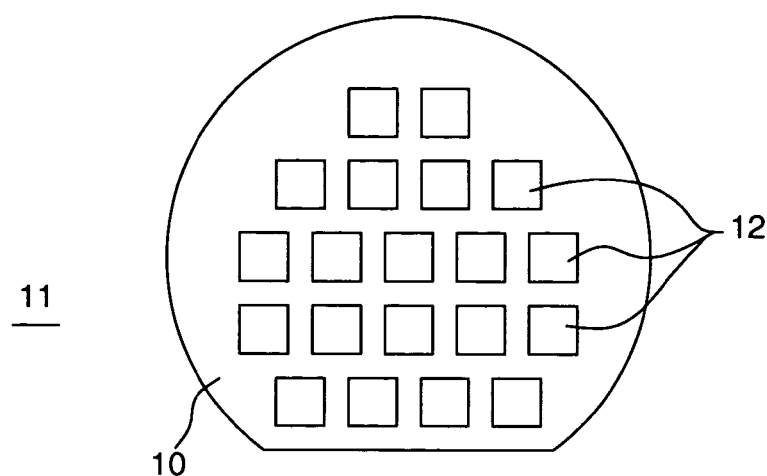
FIG. 1 is a plan view depicting an exemplary embodiment of a substrate configured in accordance with one or more aspects of the invention.

FIG. 1 is a plan view of an exemplary embodiment of a semiconductor component 11 in accordance with one or more aspects of the invention. The semiconductor component 11 comprises a substrate 10 having a plurality of semiconductor circuits formed therein ("semiconductor dice 12") (e.g., twenty are shown). For example, the semiconductor substrate 10 may be a wafer or panel having a multiplicity of semiconductor dice 12. Although the substrate 10 is illustrated as being generally circular in shape with a major flat edge, the substrate 10 may have a different shape as is conventionally known in the art. In addition, although the semiconductor component 11 is illustrated as being a substrate 10 having a plurality of semiconductor dice 12, it is to be understood that the substrate 10 may include only a single semiconductor die 12. Thus, the term "semiconductor component" is meant to encompass a substrate having multiple semiconductor dice, as well as a substrate having a single semiconductor die.

Figure 3:
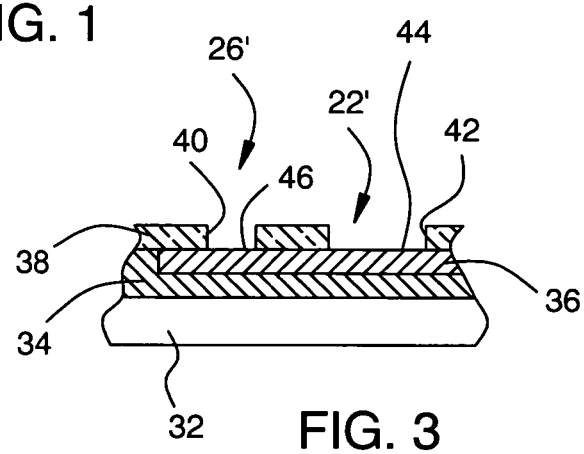
FIG. 3 is a cross-sectional view depicting a portion of the semiconductor component of FIG. 2 taken along the line 3—3.
Figure 2:
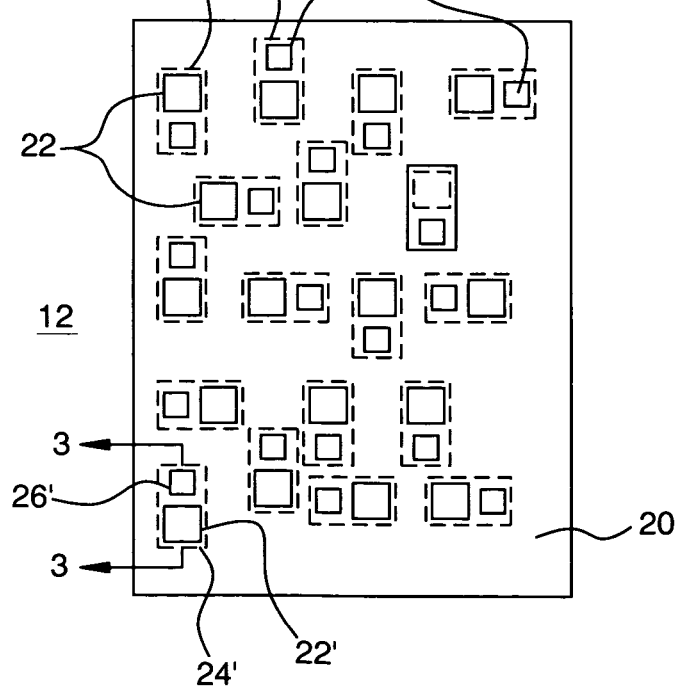
FIG. 2 is a plan view depicting an exemplary embodiment of a semiconductor component configured in accordance with one or more aspects of the invention.

FIG. 2 is a plan view depicting an exemplary embodiment of the semiconductor die 12 of FIG. 1 configured in accordance with one or more aspects of the invention. FIG. 3 is a cross-sectional view of the semiconductor die 12 of FIG. 2 taken along the line 3—3 of FIG. 2. With simultaneous reference to FIGS. 2 and 3, the semiconductor die 12 comprises a semiconductor portion 32 (e.g., silicon) having a desired electrical configuration. For example, the semiconductor die 12 may include a processor (e.g., a microprocessor or digital signal processor), memory (e.g., dynamic random access memory (DRAM) or static RAM (SRAM)), programmable logic (e.g., a field programmable gate array (FPGA) or a complex programmable logic device (CPLD)), a mask-programmable logic device (e.g., application specific integrated circuit (ASIC) or application specific standard product (ASSP)), or like-type integrated circuit devices known in the art. While the semiconductor die 12 is shown as being generally rectangular in shape, those skilled in the art will appreciate that other shapes may be utilized.

The semiconductor die 12 includes a pattern of die contacts ("bond pads 22") and a pattern of test contacts ("test pads 26") embedded within a die passivation layer 38. Each of the test pads 26 is in electrical communication with one of the bond pads 22 to define test/bond pad pairs 24. For purposes of clarity by example, a particular one of the test/bond pad pairs 24 is denoted as test/bond pad pair 24', the cross-section of which is illustratively depicted in FIG. 3. The test/bond pad pair 24' includes a particular one of the bond pads 22 and a particular one of the test pads 26, respectively denoted as bond pad 22' and test pad 26'.

The die passivation layer 38 comprises an electrically insulating material, such as an oxide (e.g., silicon dioxide ($SiO_2$)), a glass (e.g., borophosphosilicate glass (BPSG)), a polymer (e.g., polyimide), or like-type insulation material known in the art. The bond pads 22, the test pads 26, and the die passivation layer 38 are disposed on a circuit-side 20 of the semiconductor die 12, with the bond pads 22 and the test pads 26 disposed below the level of the die passivation layer 38.

The bond pads 22 and the test pads 26 may be generally square as illustrated in FIG. 2, or may have other shapes known in the art (e.g., other polygonal or elliptical shapes). Moreover, the bond pads 22 and the test pads 26 may have the same shape as shown (e.g., each of the bond pad 22' and the test pad 26' having a generally square shape), or may have different shapes (e.g., the bond pad 22' having one shape, and the test pad 26' having a different shape). The bond pads 22 may be of any size and the pattern of the bond pads 22 may have any pitch. For example, the bond pads 22 may have a size between, but not limited to, 25 µm and 200 µm on a side. The pattern of the bond pads 22 may have a pitch between, but not limited to, 90 µm and 130 µm. The bond pads 22 may be configured in a staggered grid pattern as shown in FIG. 2, or may be arranged in other configurations known in the art (e.g., a perimeter pattern).

The test pads 26 may be smaller in size than the bond pads 22 as shown. Alternatively, the test pads 26 may be the same size or larger in size than the bond pads 22. For example, the test pads 26 may have a size between, but not limited to, 25 µm and 100 µm on a side. The test pads 26 are interspersed among the bond pads 22. Notably, the test pads 26 may be disposed within interstitial regions defined by the bond pads 22, within a perimeter region defined by the bond pads 22 and the semiconductor die 12, or both. Illustratively, the test pad 26' may be disposed at any point around the perimeter of the bond pad 22' within a particular distance limited by the pitch of the pattern of the bond pads 22. For example, the test pad 26' may be separated from the bond pad 22' by a distance of, but not limited to, at least 2 µm.

The semiconductor die 12 includes a top conductor layer 36 in electrical communication with the various semiconductor devices (semiconductor circuits) within the semiconductor portion 32. The semiconductor die 12 may also include an internal conductor portion 34 comprising one or more internal conductor layers between the substrate portion 32 and the top conductor layer 36. All of the conductor layers may be separated by respective insulating layers, and may be connected to each other using vias (not shown for simplicity). The internal conductor portion 34 may be in electrical communication with the top conductor layer 36 and the semiconductor devices/circuits within the semiconductor portion 32.

The conductors of the top conductor layer 36 and the internal conductor portion 34 may be formed using a conventional semiconductor fabrication process, which may include a deposition process. Suitable materials for the conductors of the top conductor layer 36 and the internal conductor portion 34 include, for example, aluminum, chromium, titanium, nickel, iridium, copper, gold, tungsten, silver, platinum, tantalum, molybdenum, as well as alloys of such metals.

The passivation layer 38 is formed over the top conductor layer 36. Each of the bond pads 22 is located in an opening 42 of the passivation layer 38 and comprises a portion 44 of the top conductor layer 36. Each of the test pads 26 is located in an opening 40 of the passivation layer 38 and comprises a portion 46 of the top conductor layer 36. The top conductor layer 36 electrically couples the bond pads 22 with respective ones of the test pads 26 (e.g., the top conductor layer 36 electrically couples the bond pad 22' with the test pad 26'). In the present embodiment, each of the bond pads 22 is laterally separated from a respective one of the test pads 26 by a portion 48 of the passivation layer 38. The test pads 26 may be considered as "extended test pads" with respect to the bump pads 22.

The bond pads 22 are adapted to support bumped contacts (e.g., solder balls) for providing external electrical connections for the semiconductor die 12. Once the bumped contacts are in place, the semiconductor die 12 may be "flip chip" mounted (i.e., circuit-side down) to mating electrodes on a supporting substrate, such as a circuit board or leadframe. After mounting, the semiconductor die 12 may be packaged or encapsulated to form an integrated circuit (e.g., ball grid array (BGA) package, chip scale package (CSP), and like-type packages known in the art). As described below, the test pads 26 may be used to test the semiconductor die 12 before the semiconductor die 12 is bumped and without contacting the bond pads 22.

Figure 4:
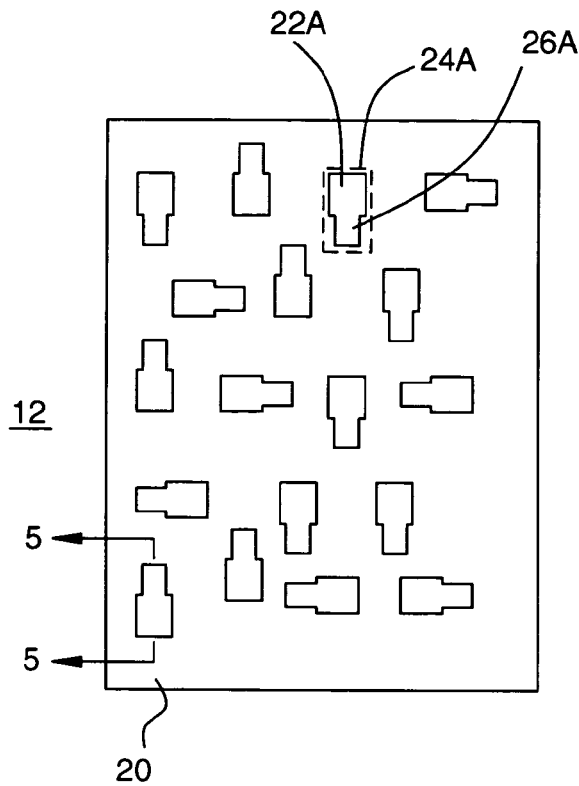
FIG. 4 is a plan view depicting another exemplary embodiment of a semiconductor component configured in accordance with one or more aspects of the invention.
Figure 5:
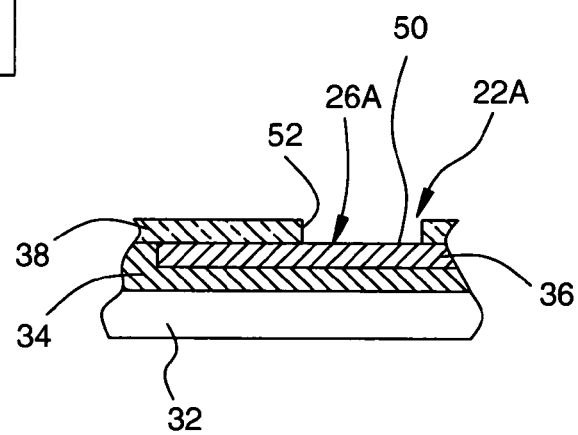
FIG. 5 is a cross-sectional view depicting a portion of the semiconductor component of FIG. 4 taken along the line 5—5.

FIG. 4 is a plan view depicting another exemplary embodiment of the semiconductor die 12 of FIG. 1 configured in accordance with one or more aspects of the invention. FIG. 5 is a cross-sectional view of the semiconductor die 12 of FIG. 4 taken along the line 5—5. Elements in FIGS. 4 and 5 that are the same or similar to those shown in FIGS. 2 and 3 are designated with identical reference numerals and are described in detail above.

With simultaneous reference to FIGS. 4 and 5, in the present embodiment, the semiconductor die 12 includes a pattern of test/bond pad pairs 24A embedded within the die passivation layer 38. Each of the test/bond pad pairs 24A comprises a die contact portion ("bond pad 22A") in electrical communication with a test contact portion ("test pad 26A"). FIG. 5 shows a cross-section of one of the test/bond pad pairs 24A.

In the present embodiment, each of the test/bond pad pairs 24A is located in an opening 52 of the passivation layer 38 and comprises a section 50 of the top conductor layer 36. A first portion of the section 50 defines the bond pad 22A, and a second portion of the section 50 defines the test pad 26A. That is, the bond pad 22A and the test pad 26A comprise separate regions of the section 50 of the top conductor layer 36. The top conductor layer 36 electrically couples the bond pad 22A with the test pad 26A. The test pad 26A may be considered as an "extended test pad" with respect to the bump pad 22A.

The test/bond pad pairs 24A may be arranged in any pattern having any pitch (e.g., a staggered grid pattern having a pitch between, but not limited to, 90 μm and 130 μm). The shapes and sizes of the bond pad 22A and the test pad 26A may be selected substantially as described above with respect to FIGS. 2 and 3. Notably, the test pad 26A may be smaller in size that the bond pad 22A as shown. Alternatively, the test pad 26A may be the same size or larger in size than the bond pad 22A. As described below, for each of the test/bond pad pair 24A, the test pad 26A may be used to test the semiconductor die 12 before the semiconductor die 12 is bumped and without contacting the bond pad 22A.

Figure 6:
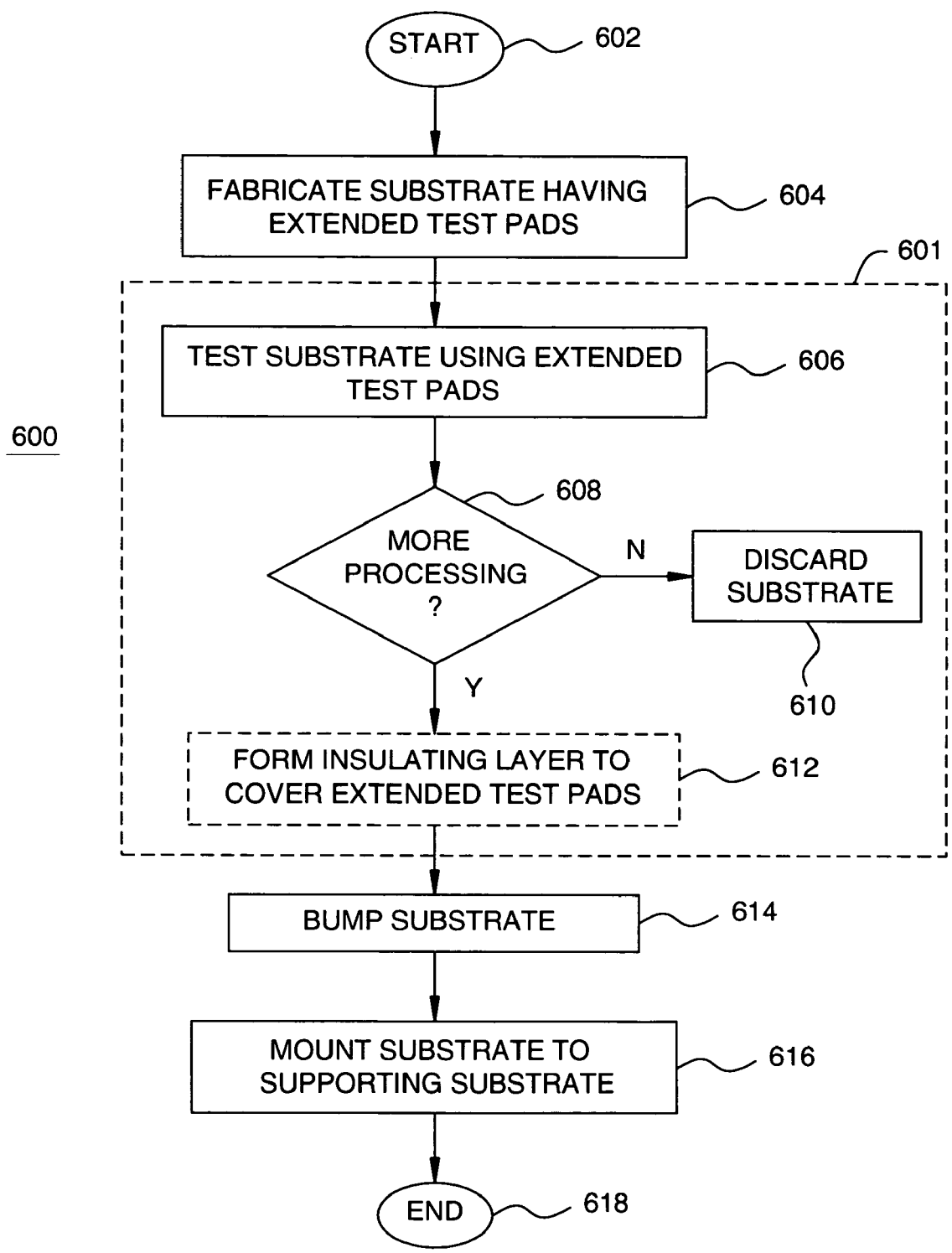
FIG. 6 is a flow diagram depicting an exemplary embodiment of a process for fabricating an integrated circuit including a semiconductor component testing process in accordance with one or more aspects of the invention.

FIG. 6 is a flow diagram depicting an exemplary embodiment of a process 600 for fabricating an integrated circuit. The process 600 includes a process 601 for testing a semiconductor component in accordance with one or more aspects of the invention. The process 600 begins at step 602. At step 604, a semiconductor substrate is fabricated by forming a plurality of semiconductor dice thereon. The semiconductor substrate may include a plurality of semiconductor components or dice. While the process 600 is described with respect to a semiconductor component comprising a substrate with a plurality of semiconductor dice, it is to be understood that the semiconductor component may include a substrate having a single semiconductor die.

In either case, each semiconductor die is fabricated with a desired electrical configuration (e.g., processor, memory, etc.) and includes a pattern of bond pads in electrical communication with test pads (also referred to herein as "extended test pads"). The bond pads are adapted to support bumped contacts (e.g., solder balls). The integrated circuit fabrication process is well-known in the art. As such, the details of such processes are not discussed herein. The semiconductor substrate 10 fabricated at step 604 is then tested in accordance with the test process 601.

The test process 601 comprises steps 606 through 612. At step 606, the semiconductor substrate is tested using the extended test pads. Notably, a "tester" or "prober" may be employed to make discrete pressure connections with the extended test pads and to provide signals (e.g., data and/or power signals) to excite or "exercise" the semiconductor devices/circuits on the substrate, and to receive results from the devices/circuits. In this manner, the die or dice of the substrate may be tested or "burned-in" before further processing (e.g., bumping, packaging, etc.). In addition, the testing device does not make contact with the actual bump pads, which avoids potential damage to the bump pads. Moreover, the semiconductor substrate may be tested before the substrate is bumped (i.e., an "un-bumped" substrate), which avoids potential damage to the bumped contacts.

At step 608, a determination is made as to whether the substrate should be further processed. If not, the process 601 proceeds to step 610, where the substrate is discarded. For example, the substrate may be discarded if a single semiconductor die has failed the test at step 606. Alternatively, the substrate may be discarded if a plurality of semiconductor dice has failed the test at step 606. The number of acceptable failures may be determined with respect to the cost of fabrication versus the cost of the further processing (e.g., cost of bumping/packaging). In this manner, if the semiconductor substrate fails the test at step 606, processing costs are mitigated and processing time is saved.

If at step 608 the substrate is to be further processed, the process 601 proceeds to optional step 612. At step 612, the extended test pads of the substrate 10 are covered with an insulating layer such as, but not limited to, polyimide or bisbenzocyclobutene (BCB). Alternatively, rather than forming or depositing an insulating layer at step 612, the insulating layer may be formed as part of a conventional bumping process (e.g., step 614 described below).

If the substrate is not discarded during the testing process 601, the fabrication process 600 proceeds to step 614. At step 614, the semiconductor substrate is bumped. That is, bumped contacts (e.g., solder balls) are formed on the substrate in electrical communication with the bump pads using a conventional bumping process. As part of the conventional bumping process, an insulating layer may be formed on the entire substrate with the exception of the bump pads before the bumped contacts are formed. In this manner, the extended test pads may be covered with the insulating layer. Alternatively, an insulating layer may be pre-formed at step 612, as described above.

At step 616, each semiconductor die on the substrate is flip chip mounted to mating electrodes on a supporting substrate using a conventional mounting process. For example, each semiconductor die may be flip chip mounted to a circuit board or lead-frame. The semiconductor die may then be packaged to form an integrated circuit (e.g., BGA, CSP, or the like). If the substrate includes multiple dice, the dice are singulated (i.e., diced) before mounting. The process 600 ends at step 618.

Figure 7:
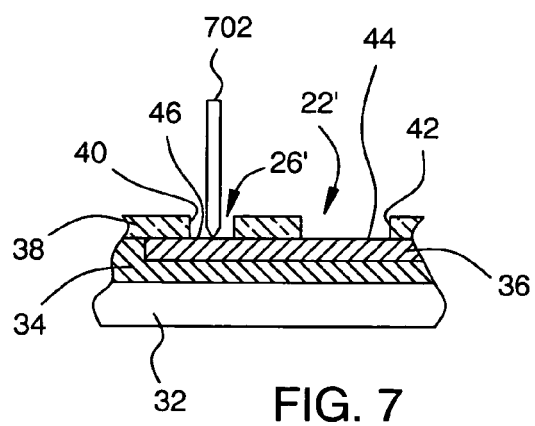
FIGS. 7–8 are sequential cross-sectional views of the semiconductor die of FIGS. 2 and 3 corresponding to various stages of the process of FIG. 6.
Figure 8:
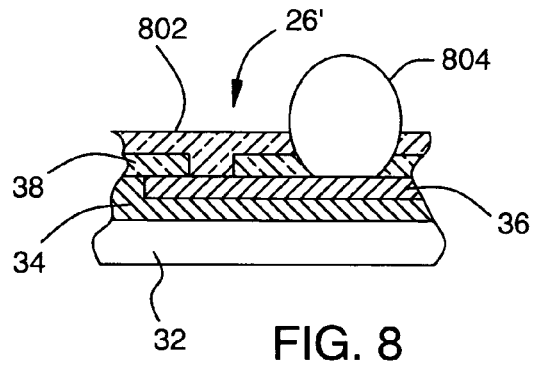

FIGS. 7–8 are sequential cross-sectional views of the semiconductor die 12 of FIGS. 2 and 3 corresponding to various stages of the process 600 of FIG. 6. In particular, FIG. 3 depicts a cross-section of the test/bond pad pair 24' after fabrication at step 604. FIG. 7 depicts a cross-section of the test/bond pad pair 24' during the testing at step 606. Notably, a probe element 702 is in contact with the portion 46 of the top metal layer 36 defining the test pad 26'. The probe element 702 does not contact the portion 44 of the top metal layer 36 defining the bond pad 22'. Thus, damage to the bond pad 22' is avoided during the testing at step 606.

FIG. 8 depicts a cross-section of the test/bond pad pair 24' after bumping at step 614. Notably, an insulating layer 802 covers the passivation layer 38 and the test pad 26'. The insulating layer 802 may be formed during the step 612, or may be formed during the bumping process in step 614. The insulating layer 802 is not formed over the bond pad 22'. Rather, a bumped contact 804 is formed in electrical communication with the bump pad 22'.

Figure 9:
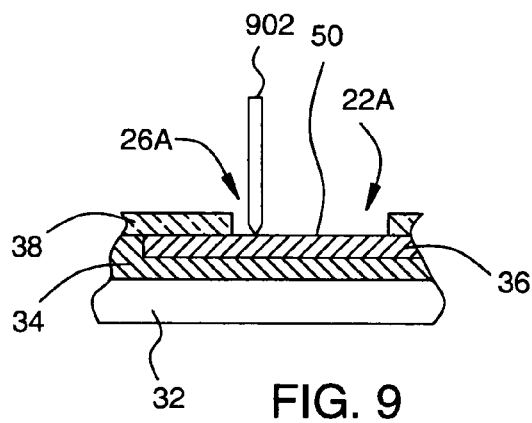
FIGS. 9–10 are sequential cross-sectional views of the semiconductor die of FIGS. 4 and 5 corresponding to various stages of the process of FIG. 6.
Figure 10:
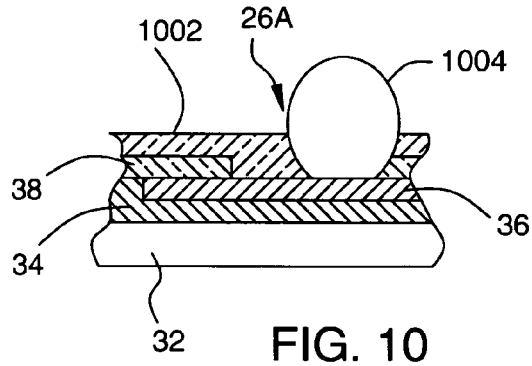

FIGS. 9–10 are sequential cross-sectional views of the semiconductor die 12 of FIGS. 4 and 5 corresponding to various stages of the process 600 of FIG. 6. In particular, FIG. 5 depicts a cross-section of the test/bond pad pair 24A after fabrication at step 604. FIG. 9 depicts a cross-section of the test/bond pad pair 24A during the testing at step 606. Notably, a probe element 902 is in contact with the portion of the conductor section 50 that defines the test pad 26A. The probe element 902 does not contact the portion of the conductor section 50 that defines the bond pad 22A. Thus, damage to the bond pad 22A is avoided during the testing at step 606.

FIG. 10 depicts a cross-section of the test/bond pad pair 24A after bumping at step 614. Notably, an insulating layer 1002 covers the passivation layer 38 and the portion of the conductor section 50 that defines the test pad 26A. The insulating layer 1002 may be formed during the step 612, or may be formed during the bumping process in step 614. The insulating layer 1002 is not formed over the portion of the conductor section 50 that defines the bond pad 22A. Rather, a bumped contact 1004 is formed in electrical communication with the bump pad 22A.

Figure 11:
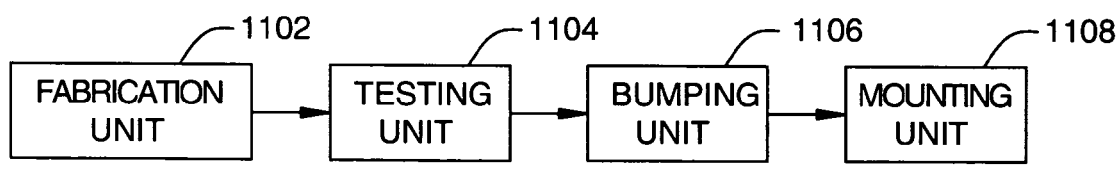
FIG. 11 is a block diagram depicting an exemplary embodiment of a system for fabricating an integrated circuit including a semiconductor testing unit configured in accordance with one or more aspects of the invention.

FIG. 11 is a block diagram depicting an exemplary embodiment of a system 1100 for fabricating an integrated circuit configured in accordance with one or more aspects of the invention. The system 1100 may be adapted to perform the process 600 of FIG. 6. Notably, the system 1100 illustratively comprises a fabrication unit 1102, a testing unit 1104, a bumping unit 1106, and a mounting unit 1108. The fabrication unit 1102 is adapted to fabricate substrates having a desired electrical configuration and a pattern of bond pads in electrical communication with test pads.

Substrates fabricated by the fabrication unit 1102 are fed to the testing unit 1104. The testing unit 1104 includes a tester or prober, such as probe card and associated control circuitry, for testing the substrates using the test pads. Substrates that pass the test(s) performed by the testing unit 1104 are fed to the bumping unit 1106, where the substrates are bumped. Bumped substrates from the bumping unit 1106 are fed to the mounting unit 1108. In the mounting unit 1108, each semiconductor die on the substrate may be mounted to a supporting substrate (e.g., circuit board or lead-frame) and may be packaged to form an integrated circuit.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

We claim:

1. A method of fabricating a semiconductor component, comprising:
   fabricating a substrate having a pattern of bond pads configured to support bumped contacts and a plurality of test pads, each of said plurality of test pads being in electrical communication with a respective one of said bond pads;
   testing said substrate using said plurality of test pads; and
   forming an insulating layer over said plurality of test pads subsequent to said testing step,
   wherein said substrate includes a conductive layer and a passivation layer disposed on said conductive layer, said conductive layer including first portions defining said bump pads and second portions defining said plurality of test pads, said passivation layer including first openings aligned with said first portions and second openings aligned with said second portions.

2. The method of claim 1, wherein said substrate includes at least one semiconductor die thereon, and wherein the method further comprises:
   mounting said at least one semiconductor die on a respective at least one support substrate.

3. The method of claim 2, wherein said support substrate comprises a circuit board or a lead-frame.

4. The method of claim 2, further comprising:
   packaging said at least one semiconductor die to form a respective at least one integrated circuit.

5. The method of claim 1, wherein said testing step comprises:
   contacting said plurality of test pads with a testing device without contacting said bond pads.

6. The method of claim 1, wherein said forming step comprises:
   covering said second openings in said passivation layer with said insulating layer.

7. The method of claim 6, further comprising:
   bumping said substrate to define a bumped contacts for said bond pads.

8. A method of fabricating a semiconductor component, comprising:
   fabricating a substrate having a pattern of bond pads configured to support bumped contacts and a plurality of test pads, each of said plurality of test pads being in electrical communication with a respective one of said bond pads;
   testing said substrate using said plurality of test pads; and
   forming an insulating layer over said plurality of test pads subsequent to said testing step,
   wherein said substrate includes a conductive layer and a passivation layer disposed on said conductive layer, said conductive layer including first portions defining said bump pads and second portions defining said plurality of test pads, said passivation layer having openings aligned with pairs of said first portions and said second portions.

9. The method of claim 8, wherein said forming step comprises:

covering portions of said openings aligned with said second portions of said conductive layer with said insulating layer.

10. The method of claim 9, further comprising:
bumping said substrate to define a bumped contacts for said bond pads.

11. The method of claim 8, wherein said substrate includes at least one semiconductor die thereon, and wherein the method further comprises:
mounting said at least one semiconductor die on a respective at least one support substrate.

12. The method of claim 11, wherein said support substrate comprises a circuit board or a lead-frame.

13. The method of claim 11, further comprising:
packaging said at least one semiconductor die to form a respective at least one integrated circuit.

14. The method of claim 8, wherein said testing step comprises:
contacting said plurality of test pads with a testing device without contacting said bond pads.

* * * * *